(12) United States Patent
Takahashi

(10) Patent No.: US 7,945,610 B2
(45) Date of Patent: May 17, 2011

(54) CONVOLUTION OPERATION CIRCUIT

(75) Inventor: Takeshi Takahashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 1006 days.

(21) Appl. No.: 11/762,782

(22) Filed: Jun. 14, 2007

(65) Prior Publication Data

US 2008/0275930 A1    Nov. 6, 2008

Related U.S. Application Data

(63) Continuation of application No. PCT/JP2005/023523, filed on Dec. 21, 2005.

(30) Foreign Application Priority Data

Dec. 24, 2004    (JP) ................... 2004-374928

(51) Int. Cl.
G06F 17/10    (2006.01)
G06F 17/15    (2006.01)
(52) U.S. Cl. ........................ 708/319; 708/420
(58) Field of Classification Search .......... 708/313, 708/316, 319, 315, 429
See application file for complete search history.

(56) References Cited

U.S. PATENT DOCUMENTS

| | | | | |
|---|---|---|---|---|
| 5,079,734 A * | 1/1992 | Riley | ............ | 708/313 |
| 5,311,457 A * | 5/1994 | Shizawa | ............ | 708/316 |
| 5,457,804 A * | 10/1995 | Ohtomo | ............ | 708/627 |
| 5,805,479 A * | 9/1998 | Tang | ............ | 708/316 |

FOREIGN PATENT DOCUMENTS

| | | |
|---|---|---|
| JP | 4-360410 A | 12/1992 |
| JP | 6-224695 A | 8/1994 |
| JP | 6-350396 A | 12/1994 |
| JP | 7-38381 A | 2/1995 |
| JP | 11-312953 A | 11/1999 |
| JP | 2002-164813 A | 6/2002 |
| JP | 2003-133911 A | 5/2003 |

* cited by examiner

*Primary Examiner* — Chuong D Ngo
(74) *Attorney, Agent, or Firm* — Jianq Chyun IP Office

(57) ABSTRACT

There is provided a convolution operation circuit that performs a convolution operation on a provided digital signal. The convolution operation circuit includes a data dividing section that generates a plurality of divided data obtained by dividing respective amplitude data of the digital signal into a plurality of bit areas, an arithmetic section that performs a predetermined convolution operation on the respective divided data of the respective amplitude data in a time-sharing mode and outputs the result, and a coupling section that couples the divided data output from the arithmetic section for each of the amplitude data.

14 Claims, 6 Drawing Sheets

CONVOLUTION OPERATION CIRCUIT

CROSS REFERENCE TO RELATED APPLICATION

This is a continuation application of PCT/JP2005/23523 filed on Dec. 21, 2005 which claims priority from a Japanese Patent Application NO. 2004-374928 filed on Dec. 24, 2004, the contents of which are incorporated herein by reference.

BACKGROUND

1. Technical Field

The present invention relates to a convolution operation circuit. More particularly, the present invention relates to a convolution operation circuit that performs a convolution operation on a provided digital signal.

2. Related Art

Conventionally, there has been known a filter circuit that restricts and outputs a band of a provided digital signal. This filter circuit generates a signal restricted in a desired band by performing a convolution operation on the digital signal, for example.

For example, a finite impulse response filter circuit includes a plurality of delay means that is serially provided and sequentially delay data of the digital signal, a plurality of multiplication sections that is provided in correspondence with the plurality of delay means and multiply a predetermined filter coefficient by data output from the corresponding delay means, and an addition section that computes a sum of data output from the plurality of multiplication sections.

By such a configuration, the finite impulse response filter circuit performs a convolution operation on each digital signal data, and generates a signal of which a band is restricted. Now, since a related patent document is not recognized, the description is omitted.

However, when the number of bits of the respective data of the digital signal to be input is large, a circuit scale of the multiplication section becomes extremely large. Moreover, when thinning the number of data of the digital signal by means of a decimation filter, the number of effective bits of the respective data increases in accordance with a thinning rate. For this reason, when performing a convolution operation on a digital signal passing through the decimation filter, a large-scale arithmetic circuit becomes necessary.

Moreover, when a thinning rate in the decimation filter is variable, the number of effective bits of a digital signal to be input into a subsequent-stage finite impulse response filter circuit varies. In this case, it is necessary that the arithmetic section in the finite impulse response filter has a scale corresponding to a maximum value of the variable number of effective bits of the digital signal, and thus this causes the increase of a circuit scale.

Therefore, it is an object of the present invention to provide a convolution operation circuit that can solve the foregoing problems. The above and other objects can be achieved by combinations described in the independent claims. The dependent claims define further advantageous and exemplary combinations of the present invention.

SUMMARY

Therefore, it is an object of some aspects of the present invention to provide a convolution operation circuit that can solve the foregoing problems. The above and other objects can be achieved by combinations described in the independent claims. The dependent claims define further advantageous and exemplary combinations of the present invention.

That is, according to the first aspect related to the innovations herein, one exemplary convolution operation circuit that performs a convolution operation on a provided digital signal may include: a data dividing section that generates a plurality of divided data obtained by dividing respective amplitude data of the digital signal into a plurality of bit areas; an arithmetic section that performs a predetermined convolution operation on the respective divided data of the respective amplitude data in a time-sharing mode and outputs the result; and a coupling section that couples the divided data output from the arithmetic section for each of the amplitude data.

The convolution operation circuit may further include a filter that reduces the number of the amplitude data of the digital signal and provides the reduced amplitude data to the data dividing section, and the data dividing section may control a division number of the amplitude data on the basis of a thinning rate of the filter. The data dividing section may compute the number of effective bits of the digital signal output from the filter on the basis of the thinning rate and increase the division number when the number of effective bits increases. The filter may be a decimation filter.

The convolution operation circuit may further include a filter that reduces the number of the amplitude data of the digital signal and provides the reduced amplitude data to the data dividing section, and the data dividing section may generate the plurality of divided data obtained by dividing the respective amplitude data by the predetermined number of bits. The filter may be a decimation filter.

The arithmetic section may include: a plurality of memory sections that is serially connected, stores the amplitude data by a predetermined time to sequentially transmit the stored amplitude data to a next stage, and outputs the respective divided data of the stored amplitude data within the predetermined time in a time-sharing mode; a plurality of multiplication sections that is provided in correspondence with the plurality of memory sections and multiplies the respective divided data sequentially output from the corresponding memory section by a predetermined operation coefficient to output the result; and an addition section that adds the divided data output from the plurality of multiplication sections in synchronization with one another and outputs the added result to the coupling section.

The respective memory sections may store the amplitude data at an address that is respectively predetermined for the divided data, and the convolution operation circuit may further include a control section that sequentially specifies in a time-sharing mode addresses at which the respective divided data are stored as an address of data to be output to the corresponding multiplication section by the respective memory sections.

The control section may control the address that is specified for the memory section on the basis of a thinning rate in the decimation filter. The data dividing section may sequentially output the respective divided data of the amplitude data, the respective memory sections may have registers of the same number as the division number of the amplitude data, which are serially provided and sequentially store and transmit the divided data sequentially output from the data dividing section, and the respective multiplication sections may receive data output from the final-stage register among the registers of the corresponding memory section and multiply the data by the operation coefficient. The respective multiplication sections may multiply the respective divided data by a plurality of divided operation coefficients that is obtained by dividing the operation coefficient into a plurality of bit areas in a time-sharing mode.

The summary does not necessarily describe all necessary features of the present invention. The present invention may also be a sub-combination of the features described above.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
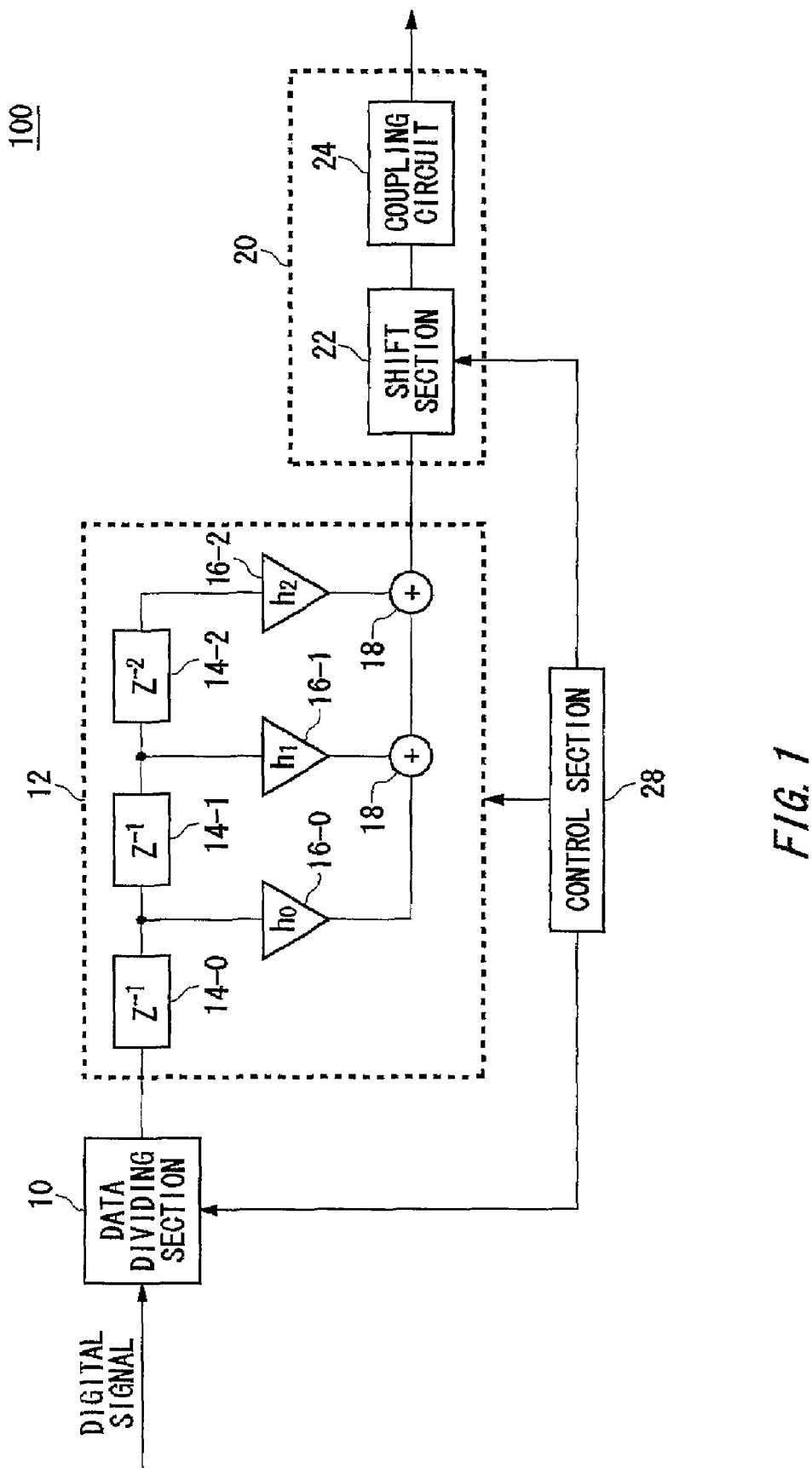
FIG. 1 is a view exemplary showing a configuration of a convolution operation circuit 100 according to an embodiment of the present invention.

FIG. 1 is a view exemplary showing a configuration of a convolution operation circuit 100 according to an embodiment of the present invention. The convolution operation circuit 100 is a circuit that performs a convolution operation on a provided digital signal, and includes a data dividing section 10, an arithmetic section 12, a coupling section 20, and a control section 28. The control section 28 controls operations of the data dividing section 10, the arithmetic section 12, and the coupling section 20. The convolution operation circuit 100 can be used as, e.g., a filter circuit that restricts a band of a digital signal.

The data dividing section 10 receives a digital signal, and generates a plurality of divided data obtained by dividing respective amplitude data of the digital signal into a plurality of bit areas. For example, the data dividing section 10 divides the respective amplitude data of the digital signal into high-order bit data and low-order bit data. At this time, the data dividing section 10 divides the amplitude data so that the number of bits of respective divided data is generally same. Moreover, the respective amplitude data may include a sign bit indicative of a sign of this amplitude.

For example, when the number of bits of amplitude data including a sign bit is B[bit] and a division number is 2, according to the data dividing section 10, it is assumed that high-order B/2 bits of the amplitude data are high-order bit data and low-order B/2 bits are low-order bit data, if the number of bits of B is an even number. Moreover, when the number of bits of B is an odd number, it is assumed that high-order B/2 bits or (B+1)/2 bits of the amplitude data are high-order bit data and remaining bits are low-order bit data.

The arithmetic section 12 has a configuration of a finite impulse response filter, for example, and performs a predetermined convolution operation on the respective divided data of the respective amplitude data in a time-sharing mode and outputs the result. In the present example, the arithmetic section 12 has a plurality of memory sections (14-0, 14-1, 14-2, generally referred to as 14), a plurality of multiplication sections (16-0, 16-1, 16-2, generally referred to as 16), and an addition section 18.

The plurality of memory sections 14 is serially connected, and stores the respective amplitude data of the digital signal by a predetermined time to sequentially transmit them to the next stage. In other words, the plurality of memory sections 14 delays the respective amplitude data of the digital signal by this predetermined time to sequentially transmit them to the next stage. Then, the plurality of memory sections 14 output the respective divided data of the stored amplitude data to the multiplication sections 16 within this predetermined time in a time-sharing mode. For example, the respective memory sections 14 store the transmitted amplitude data in address areas that are respectively predetermined for the respective divided data, and sequentially output the divided data stored in the respective address area to the corresponding multiplication section 16.

In this case, the control section 28 causes the data dividing section 10 to divide data, sequentially specifies in a time-sharing mode addresses at which the respective divided data are stored, and causes the memory sections to sequentially output the respective divided data to the multiplication sections 16. Moreover, the control section 28 causes the respective memory sections 14 to output the respectively corresponding divided data in synchronization with one another. For example, when dividing the amplitude data into two, the control section 28 causes the respective memory sections 14 to output high-order bit data of the respective amplitude data stored on the respective memory sections 14 in synchronization with one another and to output low-order bit data in synchronization with one another.

The respective multiplication sections 16 are provided in correspondence with the plurality of memory sections 14, and multiply the respective divided data sequentially output from the corresponding memory section 14 by a predetermined operation coefficient and output the results. Then, the addition section 18 respectively adds the divided data that are output from the plurality of multiplication sections 16 in synchronization with one another, and outputs the result to the coupling section 20. By such an operation, it is possible to divide a bit area of the respective amplitude data, multiply the respective divided data by the predetermined operation coefficient in a predetermined time, and output the result.

Moreover, when the data dividing section 10 outputs the respective divided data of the amplitude data in a time-sharing mode, the arithmetic section 12 may not have the memory section 14-0 corresponding to the first-stage multiplication section 16-0. When the data dividing section 10 simultaneously outputs the respective divided data, the memory section 14-0 is provided to supply the divided data to the multiplication section 16-0 in a time-sharing mode.

The coupling section 20 couples the divided data output from the arithmetic section 12 for the respective amplitude data. For example, when the arithmetic section 12 operates the amplitude data divided into two, the coupling section 20 couples high-order bit data and low-order bit data corresponding to the same amplitude data. In the present example, the coupling section 20 has a shift section 22 and a coupling circuit 24. The shift section 22 receives the divided data sequentially output from the arithmetic section 12, and shifts and outputs bits of the respective divided data on the basis of which bit area of the amplitude data corresponds to the respective divided data. For example, when dividing the amplitude data into two, high-order bit data are shifted by the number of bits of low-order bit data to be output to the coupling circuit 24 and low-order bit data are output to the coupling circuit 24 without shifting bits. The control section 28 may control a shift amount in the shift section 22. The coupling circuit 24 performs a coupling operation by adding the received divided data. According to this, it is possible to generate data which are obtained by performing a predetermined convolution operation on the respective amplitude data.

The convolution operation circuit 100 in the present example can perform an operation with the multiplication section 16 having a small circuit scale even if the number of bits of the amplitude data is large, because the convolution operation circuit 100 divides respective amplitude data of a provided digital signal and performs a convolution operation on the respective divided data in a time-sharing mode. Moreover, it is preferable that the data dividing section 10 divides the respective amplitude data of the digital signal every the predetermined number of bits. In other words, it is preferable that divided data having the predetermined number of bits are generated. At this time, the number of bits for the divided data is determined by the number of bits by which the arithmetic section 12 can process data. For example, when the multiplication section 16 can process an n-bit input data, the data dividing section 10 generates divided data less than or equal to n bits. According to this, regardless of performance of the multiplication section 16, the convolution operation circuit 100 can perform a convolution operation on a digital signal with an arbitrary bit length.

Moreover, the arithmetic section 12 may not have the memory section 14-0. In this case, the data dividing section 10 outputs the respective divided data in order. Then, the memory section 14-1 and the memory section 14-2 respectively store the divided data in address areas which are predetermined by which bit area of the amplitude data corresponds to this divided data.

Figure 2:
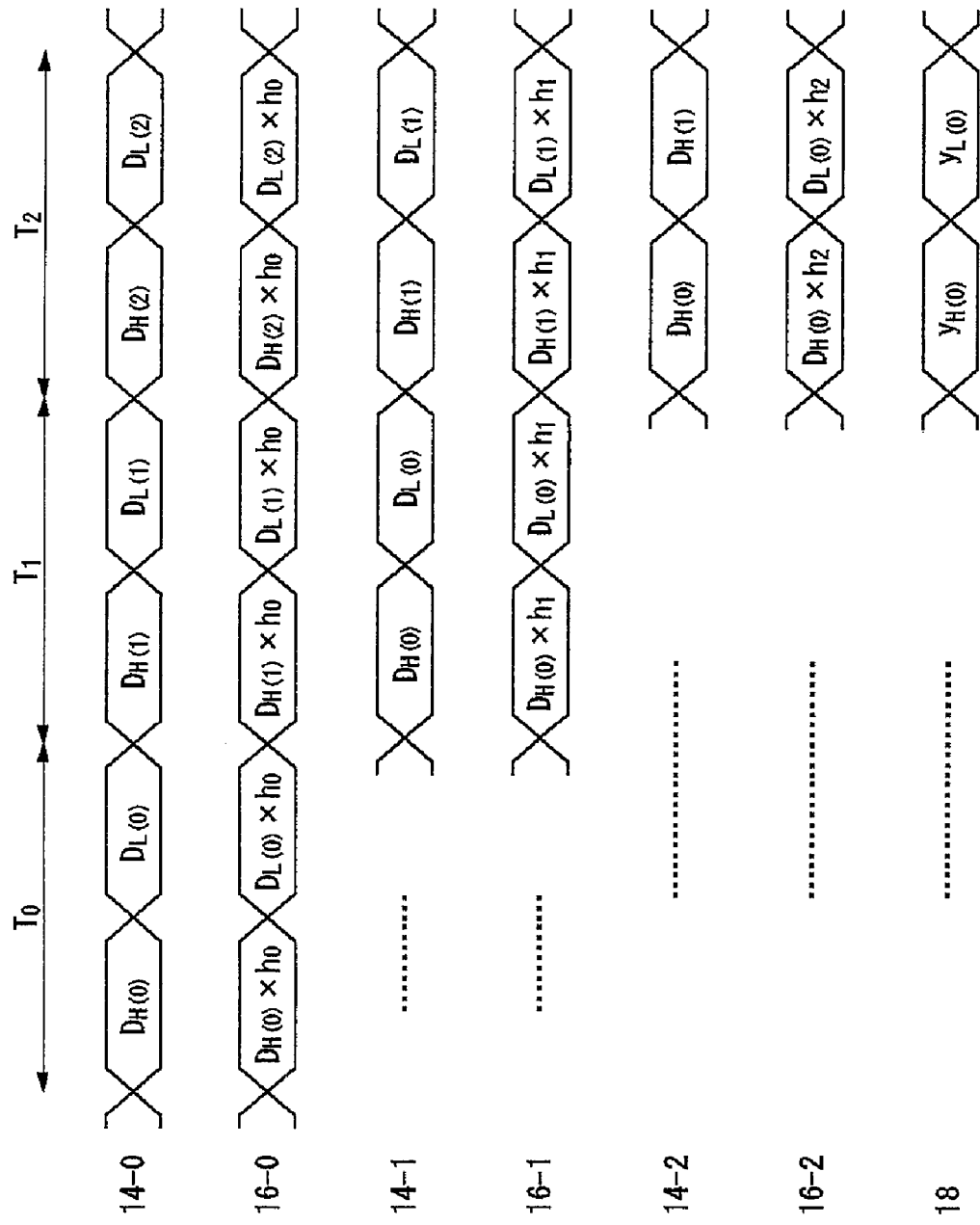
FIG. 2 is a timing chart exemplary showing an operation of a convolution operation circuit 100.

FIG. 2 is a timing chart exemplary showing an operation of the convolution operation circuit 100. In the present example, it will be described about when dividing the respective amplitude data of the digital signal into two and performs a convolution operation on the divided data. The memory section 14-0 receives the respective amplitude data D(0), D(1), . . . , which are divided into divided data by the data dividing section 10, in predetermined periods $T_0, T_1, \ldots$, respectively holds the data for this period, and sequentially transmits the data to the subsequent-stage memory section 14.

The memory section 14-0 outputs the divided data of the stored amplitude data to the multiplication section 16-0 by the time obtained by dividing the period into two in the respective periods. For example, in the period T0, the memory section 14-0 outputs high-order bit data $D_H(0)$ and low-order bit data $D_L(0)$ of the stored amplitude data D(0). Here, the divided data $D_H(k)$ shows high-order bit data of the amplitude data D(k) and the divided data $D_L(k)$ shows low-order bit data of the amplitude data D(k). Moreover, the multiplication section 16-0 multiplies each of the divided data output from the memory section 14-0 in a time-sharing mode by a predetermined operation coefficient $h_0$, and outputs the result.

Similarly, the memory section 14-1 stores the amplitude data delayed in the memory section 14-0, and outputs the divided data of the stored amplitude data to the multiplication section 16-1 by the time obtained by dividing the respective periods into two. Then, the multiplication section 16-1 multiplies each of the divided data output from the memory section 14-1 by a predetermined operation coefficient $h_1$, and outputs the result.

Similarly, the memory section 14-2 stores the amplitude data delayed in the memory section 14-1, and outputs the divided data of the stored amplitude data to the multiplication section 16-2 by the time obtained by dividing the respective periods into two. Then, the multiplication section 16-2 multiplies each of the divided data output from the memory section 14-2 by the predetermined operation coefficient $h_1$, outputs the result.

As described above, the respective memory sections 14 synchronously output high-order bit data $D_H(k)$ of the respective amplitude data in the respective periods, and further synchronously output low-order bit data $D_L(k)$. In other words, the respective multiplication sections 16 synchronously output an operation result for each of high-order and low-order bit data.

The addition section 18 outputs a sum of the high-order bit data which are synchronously output from the respective multiplication sections 16 to the coupling section 20, and outputs a sum of the low-order bit data which are synchronously output from the respective multiplication sections 16 to the coupling section 20. Then, the coupling section 20 couples the high-order bit data and the low-order bit data received from the addition section 18 as described above.

Figure 3:
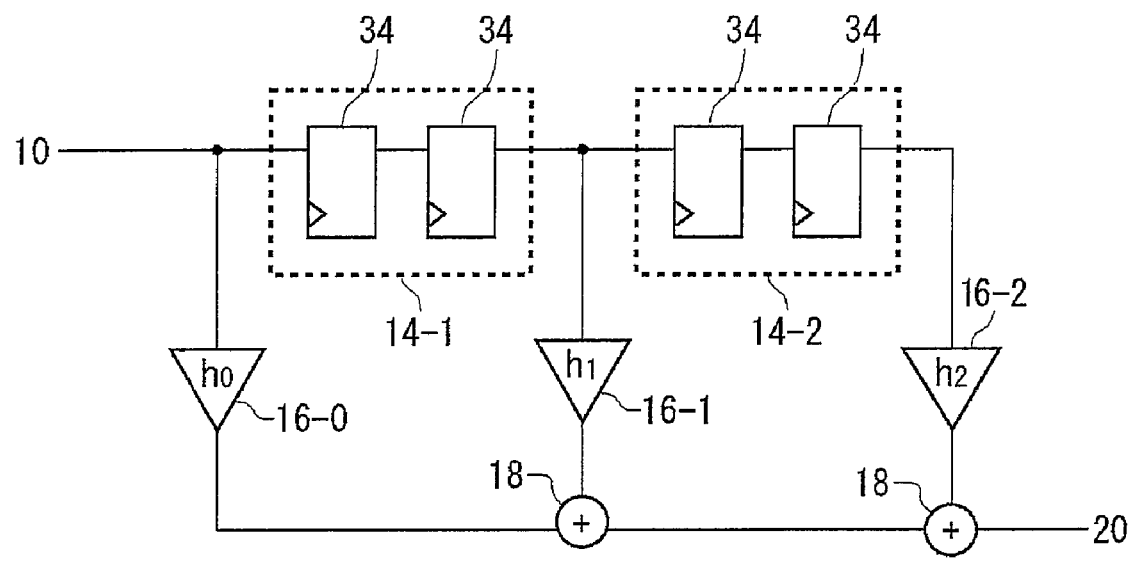
FIG. 3 is a view showing another example of a configuration of an arithmetic section 12.

FIG. 3 is a view showing another example of a configuration of an arithmetic section 12. The arithmetic section 12 in the present example does not have the memory section 14-0 in comparison with the configuration of the arithmetic section 12 described in FIG. 1. Moreover, the memory section 14-1 and the memory section 14-2 have registers 34 which are respectively connected in series. The components of FIG. 3 having the same reference numbers as those of FIG. 1 have the substantially same function and configuration as those of the components described in FIG. 1. The registers 34 of the same number as the division number of the amplitude data in the data dividing section 10 are provided. Moreover, the registers 34 that are serially provided delay the divided data by the substantially same time as the time obtained by dividing a period of the digital signal by the division number of the amplitude data, and sequentially transmit the delayed divided data.

In this case, the data dividing section 10 outputs the respective divided data of the amplitude data to the arithmetic section 12 in a time-sharing mode. For example, the data dividing section 10 may sequentially supply the respective divided data in the respective amplitude data to the arithmetic section 12 by a predetermined time, and the arithmetic section 12 may sequentially perform a predetermined convolution operation on the provided divided data. At this time, the data dividing section 10 may output the respective divided data by the time obtained by dividing a period of the provided digital signal by the division number of the amplitude data. For example, when generating high-order bit data and low-order bit data obtained by dividing the amplitude data into two, the high-order bit data and the low-order bit data may be output by the time obtained by dividing the period of the digital signal into two. The respective divided data that are output in a time-sharing mode are sequentially stored on the registers 34 in the respective memory sections 14. By such a configuration, the divided data output from the final-stage register 34 in the respective memory sections 14 become data corresponding to the same bit area in the respective amplitude data.

The respective multiplication sections 16 receive the divided data output from the final-stage register 34 among the registers 34 of the corresponding memory section 14, and multiply the divided data by a predetermined operation coefficient. By such a configuration, similarly to the convolution operation circuit 100 described in FIG. 1, it is also possible to divide the respective amplitude data of the provided digital signal and perform a convolution operation on the respective divided data in a time-sharing mode, and thus a circuit scale of the arithmetic section 12 can be reduced.

Moreover, although the multiplication section 16 in FIG. 1 and FIG. 3 multiply the divided data which are provided in a time-sharing mode by a predetermined operation coefficient, in another example, the respective multiplication sections 16 may multiply each of the divided data by a plurality of divided operation coefficients, which is obtained by dividing the operation coefficient into a plurality of bit areas, in a time-sharing mode. For example, when multiplying the amplitude data D(0) by the operation coefficient $h_0$ like the multiplication section 16-0 in the period $T_0$ shown in FIG. 2, the multiplication section 16-0 divides the period $T_0$ into four and multiplies the divided data by the divided operation coefficient for each combination of the divided data and the divided operation coefficient in the divided respective time intervals when dividing the operation coefficient $h_0$ into two and performing an operation. In other words, the multiplication section 16-0 performs operations of $D_H(0) \times h_{H0}$, $D_H(0) \times h_{L0}$, $D_L(0) \times h_{H0}$, $D_L(0) \times h_{L0}$ on the divided respective time interval. However, $h_{H0}$ shows high-order bit data of the operation coefficient $h_0$ and $h_{L0}$ shows low-order bit data of the operation coefficient $h_0$. By such a control, it is possible to further reduce a circuit scale of the multiplication section 16.

Figure 4:
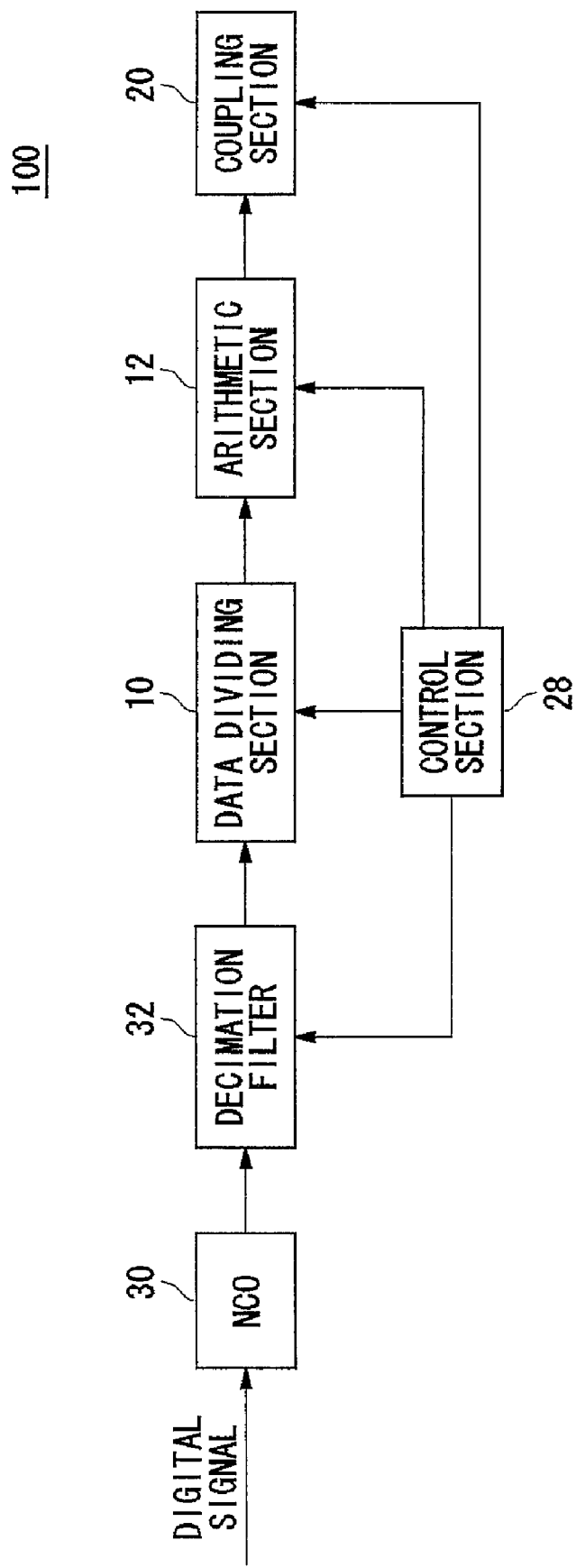
FIG. 4 is a view showing another example of a configuration of a convolution operation circuit 100.

FIG. 4 is a view showing another example of a configuration of a convolution operation circuit 100. The convolution operation circuit 100 in the present example further includes a numeric control oscillator (NCO) 30 and a decimation filter 32 in addition to the configuration of the convolution operation circuit 100 described in FIG. 1. The convolution operation circuit 100 in the present example can be used as a digital down converter. The components of FIG. 4 having the same reference numbers as those of FIG. 1 have the substantially same function and configuration as those of the components described in FIG. 1.

The numeric control oscillator 30 generates and outputs a digital signal with a predetermined period. For example, the numeric control oscillator 30 generates a digital signal obtained by demodulating sampling data that are provided from an outside analog-digital converter.

The decimation filter 32 reduces the number of amplitude data of the digital signal and supplies the reduced data to the data dividing section 10. In other words, the decimation filter 32 thins out the number of amplitude data of the digital signal and generates a low-frequency digital signal. Generally, the number of effective bits of the signal which is output from the decimation filter 32 increases compared to the number of effective bits of the signal to be input into the decimation filter 32. Moreover, the increase of the number of effective bits varies in accordance with a thinning rate of amplitude data in the decimation filter 32. For example, according to the decimation filter 32, the number of effective bits of the signal to be output increases when the thinning rate increases and the number of effective bits of the signal to be output decreases when the thinning rate decreases. The control section 28 controls the thinning rate in the decimation filter 32 to a preset thinning rate.

In such a configuration, it is preferable that the data dividing section 10 controls the division number of amplitude data on the basis of the thinning rate in the decimation filter 32. In other words, it is preferable that the data dividing section 10 controls the division number of amplitude data so that the number of bits of the respective divided data becomes a preset value, in accordance with the variation of the number of effective bits of the digital signal output from the decimation filter 32. According to this, it is possible to generate divided data according to the number of bits capable of being processed by the arithmetic section 12. For example, the data dividing section 10 computes the number of effective bits of the digital signal output from the decimation filter on the basis of the number of bits of the signal output from the numeric control oscillator 30 and the thinning rate in the decimation filter 32, and increases the division number of amplitude data when the number of effective bits increases. Moreover, the control section 28 may perform these controls.

Moreover, the data dividing section 10 may divide the respective amplitude data for each of the predetermined number of bits as described above. By such a control, it is also possible to generate divided data with the predetermined number of bits regardless of the thinning rate of the decimation filter 32.

Moreover, it is preferable that the arithmetic section 12 in the present example has the same configuration as that of the arithmetic section 12 described in FIG. 1. The arithmetic section 12 shown in FIG. 3 requires changing the number of the registers 34 and thus the control becomes difficult when changing the division number. However, since the arithmetic section 12 shown in FIG. 1 controls the address specified for the respective memory sections 14, the arithmetic section 12 can easily perform a convolution operation in a time-sharing mode even if the division number varies.

For example, even when the division number increases, the control section 28 can specify address areas in which divided data should be stored in the memory section 14 in accordance with this division number and sequentially specify these address areas in a time-sharing mode to output the divided data, in order to easily perform a convolution operation in the time-sharing mode.

Moreover, in FIGS. 1 to 4, a configuration of a finite impulse response filter has been described as an example of a configuration of the arithmetic section 12. A configuration of the arithmetic section 12 is not limited to this. Moreover, the arithmetic section 12 may be a finite impulse response filter having a configuration different from the finite impulse response filter shown in FIG. 1.

Figure 5:
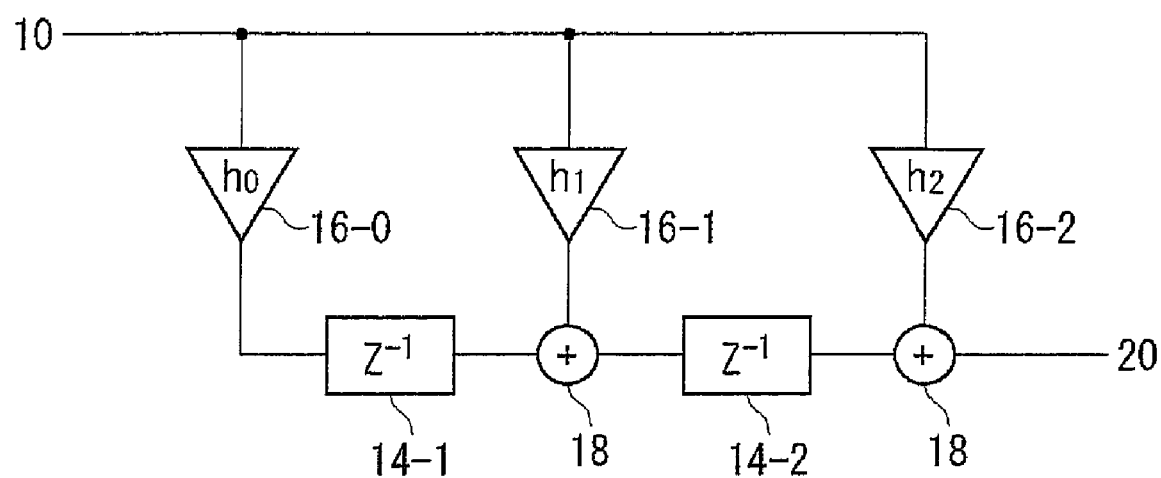
FIG. 5 is a view showing further another example of a configuration of an arithmetic section 12.

FIG. 5 is a view showing further another example of a configuration of an arithmetic section 12. The components of FIG. 5 having the same reference numbers as those of FIG. 1 have the substantially same function and configuration as those of the components described in FIG. 1. The arithmetic section 12 in the present example has a transposed configuration in which a position of the memory section 14 is changed compared to the configuration of the arithmetic section 12 shown in FIG. 1. In other words, the respective multiplication sections 16 receive the divided data of the respective amplitude data in a time-sharing mode, and multiply the divided data by a previously given operation coefficient and output the result. The memory sections 14 are provided in correspondence with the multiplication sections 16, store the divided data, which are multiplied by the corresponding multiplication section 16 by an operation coefficient, in a predetermined address area, and delay the stored data by a predetermined time to sequentially transmit the delayed data to the next stage.

Moreover, the addition section 18 sequentially adds the divided data output from the memory section 14 and the divided data output from the multiplication section 16 in correspondence with these divided data. Even in such a configuration, as described in FIG. 3, it is possible to reduce a circuit scale of the multiplication section 16.

Figure 6:
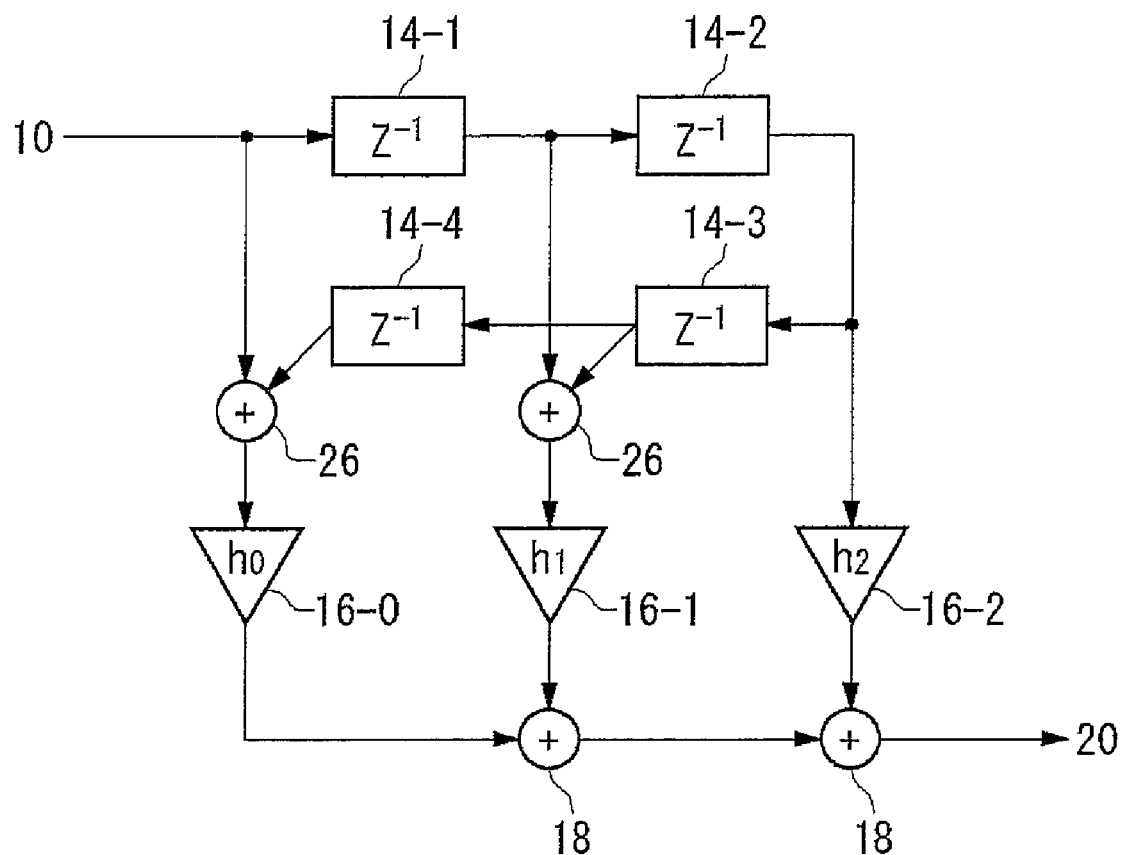
FIG. 6 is a view showing further another example of a configuration of an arithmetic section 12.

FIG. 6 is a view showing further another example of a configuration of an arithmetic section 12. The arithmetic section 12 in the present example further has memory sections 14-3 and 14-4 and an addition section 26 in addition to the configuration of the arithmetic section 12 described in FIG. 1.

The memory sections 14-1 to 14-4 are serially connected similarly to the memory sections 14 described in FIG. 1, and delay the amplitude data by a predetermined time and transmit the data. The addition section 26 adds the divided data sequentially input into the memory section 14-1 and the divided data sequentially output from the memory section 14-4 and supplies the added result to the multiplication section 16-0. Moreover, the addition section 26 adds the divided data sequentially input into the memory section 14-2 and the divided data sequentially output from the memory section 14-3 and supplies the added result to the multiplication section 16-1.

By such a configuration, when performing a convolution operation by means of amplitude data corresponding to four periods of the digital signal, for example, a waveform of this amplitude data is multiplied by a symmetric operation coefficient. In the present example, since the data which should be multiplied by the same operation coefficient is added and the added data is input into the multiplication section 16, it is possible to reduce the number of the multiplication sections 16 and thus reduce the circuit scale of the arithmetic section 12. Moreover, in the configuration of FIG. 6, the arithmetic section 12 may have a transposed configuration in which the arrangement of the memory sections 14 is changed, similarly to the arithmetic section 12 shown in FIG. 5.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention. As apparent from the above descriptions, according to one embodiment of the present invention, it is possible to realize a convolution operation circuit that can perform a convolution operation on a small circuit scale.

What is claimed is:

1. A convolution operation circuit that performs a convolution operation on a provided digital signal, comprising:
    a data dividing section that generates a plurality of divided data obtained by dividing respective amplitude data of the digital signal into a plurality of bit areas;
    an arithmetic section that performs a predetermined convolution operation on the respective divided data of the respective amplitude data in a time-sharing mode and outputs a result of the predetermined convolution operation;
    a coupling section that couples the result outputted from the arithmetic section for each of the amplitude data; and
    a filter that reduces the number of the amplitude data of the digital signal and provides the reduced amplitude data to the data dividing section, wherein
    the data dividing section controls a division number of the amplitude data on the basis of a thinning rate of the filter.

2. The convolution operation circuit as claimed in claim 1, wherein the data dividing section computes the number of effective bits of the digital signal output from the filter on the basis of the thinning rate and increases the division number when the number of effective bits increases.

3. The convolution operation circuit as claimed in claim 2, wherein the filter is a decimation filter.

4. The convolution operation circuit as claimed in claim 3, wherein
    the arithmetic section comprises:
    a plurality of memory sections that is serially connected, stores the amplitude data by a predetermined time to sequentially transmit the stored amplitude data to a next stage, and outputs the respective divided data of the stored amplitude data within the predetermined time in a time-sharing mode;
    a plurality of multiplication sections that is provided in correspondence with the plurality of memory sections and multiplies the respective divided data sequentially output from the corresponding memory section by a predetermined operation coefficient to output the result; and
    an addition section that adds the divided data output from the plurality of multiplication sections in synchronization with one another and outputs the added result to the coupling section.

5. The convolution operation circuit as claimed in claim 4, wherein
    the respective memory sections stores the amplitude data at an address that is respectively predetermined for the divided data, and
    the convolution operation circuit further comprises a control section that sequentially specifies in a time-sharing mode addresses at which the respective divided data are stored as an address of data to be output to the corresponding multiplication section by the respective memory sections.

6. The convolution operation circuit as claimed in claim 5, wherein the control section controls the address that is specified for the memory section on the basis of a thinning rate in the decimation filter.

7. The convolution operation circuit as claimed in claim 4, wherein
    the data dividing section sequentially outputs the respective divided data of the amplitude data,
    the respective memory sections have registers of the same number as the division number of the amplitude data, which are serially provided and sequentially store and transmit the divided data sequentially output from the data dividing section, and
    the respective multiplication sections receive data output from the final-stage register among the registers of the corresponding memory section and multiply the data by the operation coefficient.

8. The convolution operation circuit as claimed in claim 4, wherein the respective multiplication sections multiply the respective divided data by a plurality of divided operation coefficients that is obtained by dividing the operation coefficient into a plurality of bit areas in a time-sharing mode.

9. The convolution operation circuit as claimed in claim 1, wherein the filter is a decimation filter.

10. The convolution operation circuit as claimed in claim 9, wherein
    the arithmetic section comprises:
    a plurality of memory sections that is serially connected, stores the amplitude data by a predetermined time to sequentially transmit the stored amplitude data to a next stage, and outputs the respective divided data of the stored amplitude data within the predetermined time in a time-sharing mode;
    a plurality of multiplication sections that is provided in correspondence with the plurality of memory sections and multiplies the respective divided data sequentially output from the corresponding memory section by a predetermined operation coefficient to output the result; and an addition section that adds the divided data output from the plurality of multiplication sections in synchronization with one another and outputs the added result to the coupling section.

11. The convolution operation circuit as claimed in claim 10, wherein the respective memory sections stores the amplitude data at an address that is respectively predetermined for the divided data, and the convolution operation circuit further comprises a control section that sequentially specifies in a time-sharing mode addresses at which the respective divided data are stored as an address of data to be output to the corresponding multiplication section by the respective memory sections.

12. The convolution operation circuit as claimed in claim 11, wherein the control section controls the address that is specified for the memory section on the basis of a thinning rate in the decimation filter.

13. The convolution operation circuit as claimed in claim 10, wherein the data dividing section sequentially outputs the respective divided data of the amplitude data, the respective memory sections have registers of the same number as the division number of the amplitude data, which are serially provided and sequentially store and transmit the divided data sequentially output from the data dividing section, and the respective multiplication sections receive data output from the final-stage register among the registers of the corresponding memory section and multiply the data by the operation coefficient.

14. The convolution operation circuit as claimed in claim 10, wherein the respective multiplication sections multiply the respective divided data by a plurality of divided operation coefficients that is obtained by dividing the operation coefficient into a plurality of bit areas in a time-sharing mode.

\* \* \* \* \*